(12) United States Patent
Hikmet

(10) Patent No.: US 9,547,119 B2
(45) Date of Patent: Jan. 17, 2017

(54) COLOR TEMPERATURE VARIABLE LIGHT EMITTER

(75) Inventor: Rifat Ata Mustafa Hikmet, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 1303 days.

(21) Appl. No.: 13/383,475

(22) PCT Filed: Jul. 12, 2010

(86) PCT No.: PCT/IB2010/053171
§ 371 (c)(1),
(2), (4) Date: Mar. 22, 2012

(87) PCT Pub. No.: WO2011/007307
PCT Pub. Date: Jan. 20, 2011

(65) Prior Publication Data
US 2012/0170275 A1   Jul. 5, 2012

(30) Foreign Application Priority Data
Jul. 14, 2009   (EP) ...................................... 09165374

(51) Int. Cl.
*F21V 8/00* (2006.01)
*H01L 33/50* (2010.01)
*H01L 33/60* (2010.01)

(52) U.S. Cl.
CPC .............. *G02B 6/005* (2013.01); *G02B 6/0018* (2013.01); *G02B 6/0073* (2013.01); *H01L 33/504* (2013.01); *H01L 33/60* (2013.01)

(58) Field of Classification Search
CPC .............. F21Y 2101/02; F21Y 2105/00; F21Y 2113/005; F21K 9/00; F21K 9/56; F21K 9/52; H01L 2924/0002; H01L 2224/73265; H01L 33/504; H01L 33/60; H01L 33/58; H01L 33/502; H01L 2924/12041; G02B 6/0026; G02B 6/0028; G02B 6/0068; G02B 6/0003; G02B 6/0073; G02B 6/005; G02B 6/0018; G02F 1/133603; Y02B 20/181; Y10S 362/80; H05B 33/0857; H04N 9/315; B60Q 1/44; B60Q 1/46; B60Q 1/302; B60Q 1/52; B60Q 2400/20; G03B 21/204
(Continued)

(56) References Cited

U.S. PATENT DOCUMENTS 7,745,985 B2 * 6/2010 Tanimoto et al. ............. 313/501
2008/0122343 A1   5/2008 Maruyama et al.
(Continued)

FOREIGN PATENT DOCUMENTS

GB   2428879 A   2/2007
JP   2008123969 A   5/2008
(Continued)

OTHER PUBLICATIONS

Stacked_LEDs.pdf—See highlighted text. "Vertically-stacked color-tunable LEDs", Phys. Status Solidi C, 2009, 1-3. Downloaded from Internet. Optimal color mixing and minimal absorption losses are obtained with vertically stacked LEDs.

*Primary Examiner* — Stephen F Husar
*Assistant Examiner* — Danielle Allen

(57) ABSTRACT

The invention relates to a color temperature variable light emitter and a method, adapted for generating color temperature variable light. The color temperature variable light emitter comprises a first phosphor (1) and a second phosphor (2), the first phosphor (1) and the second phosphor (2), when pumped with pump light, being adapted for emitting first phosphor light and second phosphor light, respectively, the first phosphor light having a different wavelength from the second phosphor light, and an exit surface (11) adapted for emitting the color temperature variable light, wherein the
(Continued)

first phosphor (1) and the second phosphor (2) are stacked in a stacking direction in such a way that at least part of the first phosphor light and at least part of the second phosphor light are combined in the exit surface (11) and emitted as the color temperature variable light, and the first phosphor (1) and the second phosphor (2) can be individually pumped by first pump light and second pump light, respectively, the first pump light and the second pump light being incident laterally relative to the stacking direction. In this way, a uniform mixing of light is achieved while preserving a high intensity of the color temperature variable light emitter.

13 Claims, 5 Drawing Sheets

(58) Field of Classification Search
USPC ......... 362/84, 231, 260, 555, 293, 510, 560, 362/800, 611, 615; 257/98, 99, E33.061, 257/89; 313/483, 501, 503, 502, 485; 250/458.1
See application file for complete search history.

(56) References Cited

U.S. PATENT DOCUMENTS

| | | | |
|---|---|---|---|
| 2008/0142816 | A1 | 6/2008 | Bierhuizen et al. |
| 2010/0051974 | A1* | 3/2010 | Krames .......................... 257/89 |

FOREIGN PATENT DOCUMENTS

| | | |
|---|---|---|
| JP | 2008130279 A | 6/2008 |
| JP | 2010506348 A | 2/2010 |
| WO | 2007105739 A1 | 9/2007 |
| WO | 2008146200 A1 | 12/2008 |
| WO | 2008146290 A2 | 12/2008 |

\* cited by examiner

COLOR TEMPERATURE VARIABLE LIGHT EMITTER

FIELD OF THE INVENTION

The invention relates to a color temperature variable light emitter and to a method, adapted for generating color temperature variable light.

BACKGROUND OF THE INVENTION

Document WO 2008/146290 A2 describes a light source device comprising at least one light emitting element, an optical funnel for distributing light emitted by the light emitting element into a waveguide material which is in optical communication with the optical funnel and at least one reflector contacting the waveguide material for redirecting light back into the waveguide material such as to reduce illumination exiting the waveguide material in any direction other than a circumferential direction.

Different colors can be produced with a color variable lamp where phosphor is stacked on top of at least two chips emitting at two different wavelengths. The phosphor is chosen in such a way that it absorbs light differently at different wavelengths. However, two or more chips placed next to each other are required in order to increase the emission area. Furthermore, different colors are produced next to each other rather than on top of each other and due to the overlap in the absorption spectra of phosphors it is difficult to produce saturated colors.

SUMMARY OF THE INVENTION

It is the object of the invention to provide a possibility to obtain a color temperature variable light emitter where emitted light originates from a common surface area and uniform mixing of light is obtained in conjunction with preserving the high intensity of the color temperature variable light emitter.

This object is achieved by the subject matter of the independent claims. Preferred embodiments are defined in the sub claims.

According to a first aspect of the invention, this object is achieved by a color temperature variable light emitter comprising a first phosphor and a second phosphor, the first phosphor and the second phosphor, when pumped with pump light, being adapted for emitting first phosphor light and second phosphor light, respectively, the first phosphor light having a different wavelength from the second phosphor light, and further comprising an exit surface adapted for emitting the color temperature variable light, wherein the first phosphor and the second phosphor are stacked in a stacking direction in such a way that at least part of the first phosphor light and at least part of the second phosphor light are combined in the exit surface and emitted as the color temperature variable light, and the first phosphor and the second phosphor can be individually pumped by first pump light and second pump light, respectively, the first pump light and the second pump light being incident laterally relative to the stacking direction.

It is noted that the feature that "the first phosphor and the second phosphor can be individually pumped by first pump light and second pump light, respectively" means that the intensity of the first phosphor light relative to the intensity of the second phosphor light is controllable by the intensity of the first pump light relative to the second pump light. It goes without saying that "emitting phosphor light" means emitting luminescent radiation. It is worth noting that the invention provides a color temperature variable light emitter, which is adapted for emitting various colors, wherein the light emission is originating from a common surface area. It is further noted that the term "color temperature variable light" refers to color light and/or to (color) temperature variable light.

According to a preferred embodiment of the invention, the color temperature variable light emitter further comprises a reflector which is arranged on at least part of a surface of the first phosphor and/or the second phosphor, wherein the reflector is adapted for redirecting at least a part of the optical radiation back to the first phosphor and/or the second phosphor, respectively. Preferably, the first phosphor and the second phosphor are arranged such that a surface of the second phosphor is at least partly overlapping with a surface of the first phosphor or a surface of the second phosphor is close to a surface of the first phosphor such that emission from the first phosphor and the second phosphor interact. Preferably, the first phosphor and the second phosphor are arranged such that a surface of the second phosphor does not overlap with a surface of the first phosphor. The term "the first phosphor and the second phosphor are arranged" means that the first phosphor and the second phosphor are patterned and/or stacked.

According to another preferred embodiment of the invention, the color temperature variable light emitter further comprises a light extraction layer which is optically coupled to the exit surface and is adapted for directing optical radiation irradiated at least partly in the stacking direction towards the exit surface.

According to yet another preferred embodiment of the invention, the color temperature variable light emitter further comprises a selective reflector arranged on at least a part of a side surface of the first phosphor and/or the second phosphor, wherein the selective reflector is adapted for selectively transmitting the pump light and for selectively reflecting at least a part of the phosphor light emitted towards the selective reflector back to the first phosphor and/or to the second phosphor. Preferably, the reflector is connected to a heat sink adapted for cooling the first phosphor and/or the second phosphor. A first layer is preferably arranged between the second phosphor and the light extraction layer and is adapted for reflecting pump light and for transmitting phosphor light. Preferably, the color temperature variable light emitter further comprises a second layer arranged between the first phosphor and the second phosphor, wherein the second layer is adapted for reflecting pump light and for reflecting and/or for transmitting phosphor light. Preferably, the first layer and/or the second layer is/are air or a transparent low refractive index material. The first layer and/or the second layer preferably correspond to an air gap.

According to yet another preferred embodiment of the invention, the color temperature variable light emitter further comprises at least one waveguide arranged in the stacking direction between a part of the reflector and the exit surface, wherein the waveguide is adapted for directing optical radiation at least partly parallel to the stacking direction into the first phosphor and/or the second phosphor, respectively.

According to yet another preferred embodiment of the invention, the first phosphor and/or the second phosphor is/are highly transparent showing low scattering. The first phosphor and/or the second phosphor preferably comprise(s) an aspect ratio ≥2, more preferably ≥10, most preferably ≥100. The first phosphor and/or the second phosphor is/are preferably optically coupled to at least one waveguide.

According to yet another preferred embodiment of the invention, the first phosphor and the second phosphor are placed in a patterned manner on waveguides and stacked such that a surface of the second phosphor does not overlap with a surface of the first phosphor.

According to yet another preferred embodiment of the invention, a pump source emitting pump light comprises a light emitting diode and/or a laser. Preferably, the light emitting diode comprises an inorganic material and/or an organic material. Preferably, the laser comprises a semiconductor laser and/or a solid-state laser.

It is worth noting that light entering the phosphors can be originating from an optical source, such as a laser source, wherein the light can be split into a plurality of beams and the relative intensity can be controlled by optical components, such as switchable optical elements. Therefore, the color temperature variable light emitter is preferably applicable as a light source in different technological fields.

According to a second aspect of the invention, above mentioned object is achieved by a method, for generating color temperature variable light, comprising the steps: a) pumping a first phosphor and a second phosphor with pump light, thereby generating first phosphor light and second phosphor light, respectively, the first phosphor light having a different wavelength from the second phosphor light, b) combining at least part of the first phosphor light and at least part of the second phosphor light, and c) emitting the combined light as color temperature variable light.

It is an idea of the invention to use stacked phosphors, which are individually pumped from the side. Preferably, the phosphors are placed in a reflective heat sink. It is worth noting that by changing the relative intensity of the pump light falling onto the vertically aligned components, the relative emission intensity from a component is adjustable and hence the color and color temperature of the emitted light is adjustable as well. Moreover, undesired color mixing is avoided and a high efficiency is obtained.

It is also an idea of the invention to minimize re-absorption of light emitted by a phosphor layer in the stacking direction. It is therefore advantageous to use phosphor layers such that pumping the phosphor or phosphor layer from a side results in a longer path length for the pump light than when the phosphor is illuminated from the bottom. This is preferably achieved when a phosphor layer with a high aspect ratio is used. In other words, the thickness of the phosphor layer is preferably larger than the lateral direction, for instance, in the pumping direction. The aspect ratio, i.e. the length in the direction of pumping or in the thickness direction, of the phosphor is preferably ≥2, more preferably ≥10, most preferably ≥100.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
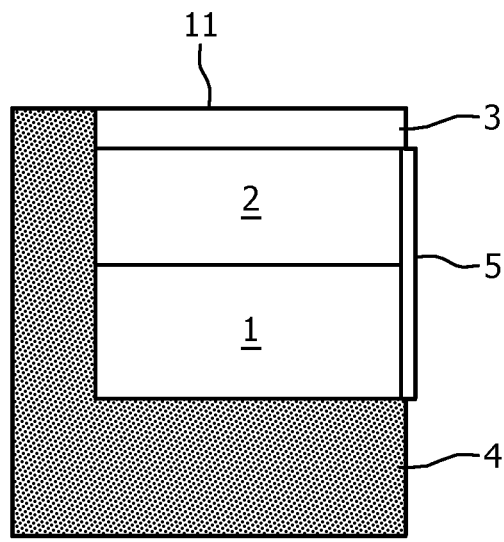
FIG. 1 shows a first configuration of a color temperature variable light emitter according to a first preferred embodiment of the invention.

FIG. 1 shows the cross section of a first configuration of a color temperature variable light emitter according to a first preferred embodiment of the invention. The color temperature variable light emitter comprises three layers, which are stacked on top of each other, where blue, violet or ultraviolet (UV) light enters as pump light from a side surface of the arrangement. The color temperature variable light emitter is adapted for emitting optical radiation through an exit surface 11, which is arranged on top of the arrangement according to the first preferred embodiment of the invention. A first phosphor 1 and a second phosphor 2 are adapted for emitting optical radiation upon excitation by the pump wavelength. The emission spectrum of the first phosphor 1 is different than the emission spectrum of the second phosphor 2. Each of the first phosphor 1 and the second phosphor 2 comprises at least one light-emitting surface, which is adapted for emitting phosphor light in a predefined solid angle. A pump source is provided (not shown in FIG. 1) which is adapted for emitting pump light directed to a side surface of the arrangement. Further, a reflector 4 is provided, wherein the reflector is arranged on at least a part of the side surface of the arrangement and is adapted for reflecting at least a part of the optical radiation emitted from the color temperature variable light emitter back to the first phosphor 1 and to the second phosphor 2. This reflector is preferably a diffuse reflector comprising materials such as oxides, aluminum oxide, titanium dioxide or nitrides, such as boron nitride. It is also advantageous if the reflector also shows large heat conductivity. As shown in FIG. 1, the first phosphor 1 and the second phosphor 2 are arranged in such a way that their arrangement corresponds to a vertical stack arrangement relative to a fixed ground.

According to the first preferred embodiment of the invention, the arrangement is pumped from a side. FIG. 1 illustrates that light enters the area from a point and spreads out over the whole surface of the first phosphor 1 and the second phosphor 2. In order to avoid phosphor emission escaping from the pump entrance, this entrance is covered with a selective reflector 5 arranged on at least a part of a side surface of the arrangement, wherein the selective reflector 5 corresponds to a coating and is adapted for transmitting a pump wavelength and for reflecting phosphor emission. It is noted that in the first phosphor 1 and in the second phosphor 2 a full conversion of the pump wavelengths takes place and no pump light escapes to other layers or components, respectively. The color temperature variable light emitter comprises a light extraction layer 3, which is optically coupled to the exit surface 11 of the arrangement and is adapted for directing optical radiation towards the exit surface 11. When blue excitation light is used this light extraction layer 3 does not need to convert the pump wavelength to another color and blue light is extracted according to the first preferred embodiment of the invention. It is noted that the light extraction layer 3 also serves for further homogenization of light from different components. According to other preferred embodiments of the invention, the pump wavelength is violet or UV and thus the light extraction layer 3 is preferably a phosphor layer for converting the pump light to blue light. Furthermore, the leakage of pump light into other phosphor layers can be avoided.

Figure 2:
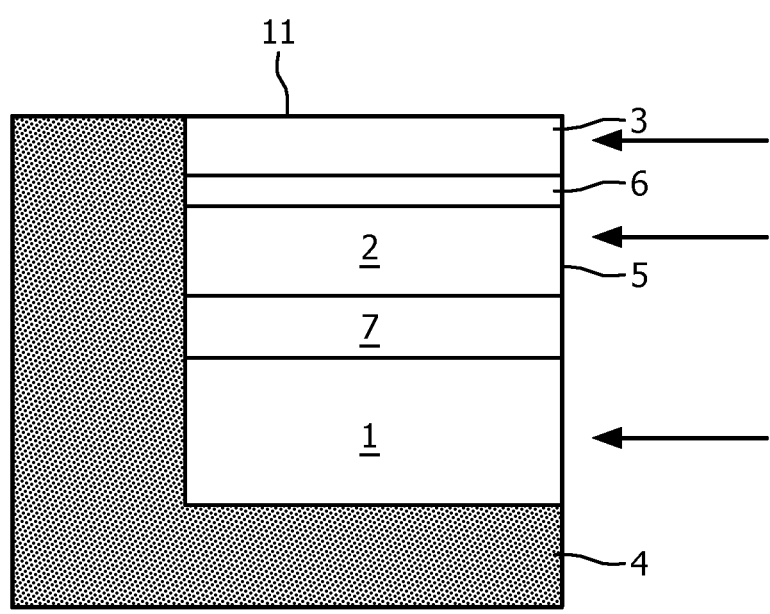
FIG. 2 shows a second configuration of a color temperature variable light emitter according to a second preferred embodiment of the invention.

FIG. 2 shows a second configuration of a color temperature variable light emitter according to a second preferred embodiment of the invention. The layers are pumped from the side and are separated by a first layer 6 and a second layer 7 which both are adapted for avoiding the leakage of the pump wavelength(s). If the phosphor layers comprise transparent materials, such as ceramics showing low scattering, the first layer 6 and the second layer 7 may comprise an air gap or a low refractive index material according to the second preferred embodiment of the invention. The refractive index of the low refractive index material is preferably ≤1.4, more preferably ≤1.5, and most preferably ≤1.2. When such transparent phosphor layers are used it is advantageous to place an air gap or add a low refractive index material between the bottom surface of the phosphor layer 1 and the reflector 4 (not shown in the figure). However, according to other preferred embodiments of the invention, a layer that reflects the pump wavelength and transmits phosphor emission is used. It is worth noting that the second layer 7 may also reflect light with a longer wavelength than the pump wavelength, according to yet other preferred embodiments of the invention, so that the second layer 7 is also adapted for reflecting the emission range by the second phosphor 2 which might get absorbed by the first phosphor 1. The first layer 6 is arranged between the second phosphor 2 and the light extraction layer 3 and is adapted for reflecting pump light and for transmitting phosphor light. The second layer 7 is arranged between the first phosphor 1 and the second phosphor 2, wherein the second layer 7 is adapted for reflecting pump light and transmitting phosphor light. According to the second preferred embodiment of the invention, the first layer 6 and the second layer 7 comprise an air gap.

Figure 3:
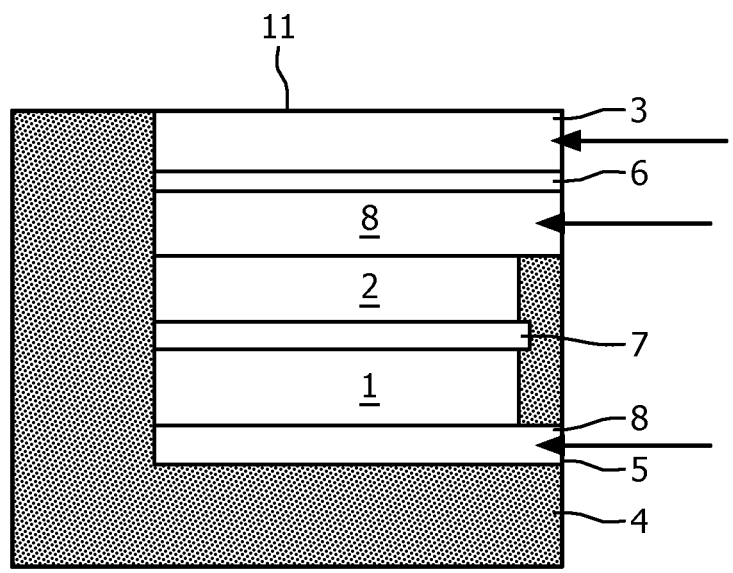
FIG. 3 shows a third configuration of a color temperature variable light emitter according to a third preferred embodiment of the invention.
Figure 4:
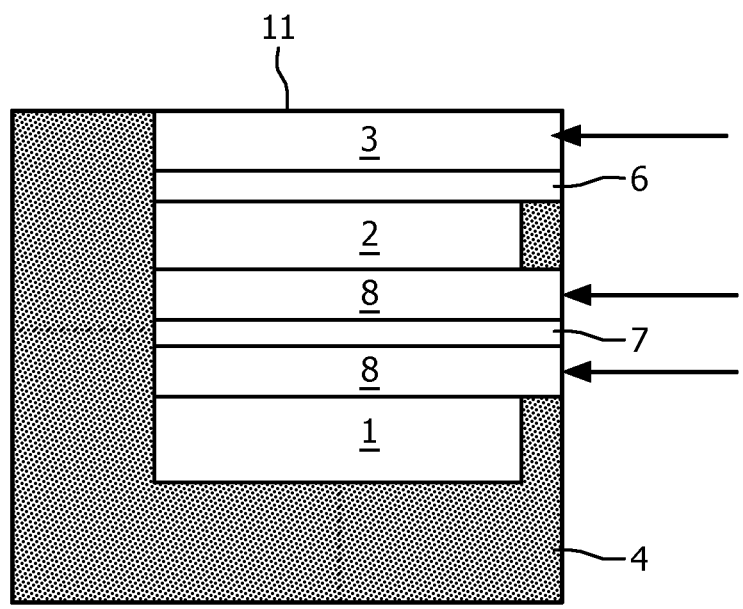
FIG. 4 shows a fourth configuration of a color temperature variable light emitter according to a fourth preferred embodiment of the invention.
Figure 5:
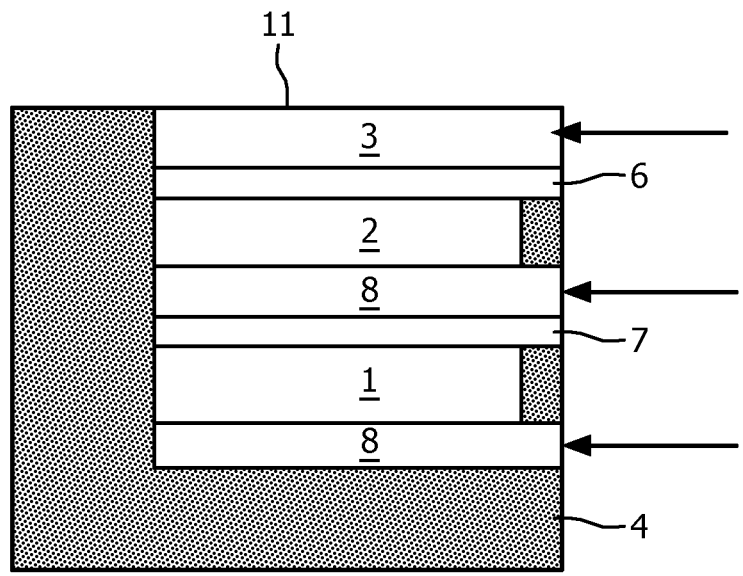
FIG. 5 shows a fifth configuration of a color temperature variable light emitter according to a fifth preferred embodiment of the invention.

FIGS. 3 to 5 show different configurations of a color temperature variable light emitter according to the third, the fourth and the fifth preferred embodiment of the invention, respectively. According to the third preferred embodiment of the invention, as shown in FIG. 3, light is coupled into a phosphor through two waveguides 8. One waveguide 8 is arranged between the second phosphor 2 and the light extraction layer 3. Another waveguide 8 is arranged between the first phosphor 1 and at least a part of the reflector 4. At its interface each waveguide is in optical contact with it adjacent phosphor layer.

FIG. 4 shows the fourth preferred embodiment of the invention, wherein a waveguide 8 is arranged between the first phosphor 1 and the second layer 7. The other waveguide 8 is arranged between the second phosphor 2 and the second layer 7 such that the second layer 7 is sandwiched between the two waveguides 8. Therefore, FIG. 4 illustrates that both waveguides 8 are arranged between the first phosphor 1 and the second phosphor 2.

FIG. 5 shows the fifth preferred embodiment of the invention, and illustrates yet another possibility of placing the waveguides 8 in the stacking direction.

According to the third, the fourth and the fifth preferred embodiment of the invention, when transparent phosphor layers showing low scattering are used for 2 and 1 then first layer 6 and the second layer 7 may be an air gap or a material with a low refractive index. When such transparent phosphor layers are used it is advantageous to place an air gap or add a low refractive index material between bottom surface of the phosphor layer 1 and the reflector 4 (not shown in FIG. 4) or between bottom surface of the waveguide 8 and the reflector 4 (not shown in FIGS. 3 and 5). According to other preferred embodiments of the invention, also a layer that preferably reflects the pump wavelength and preferably transmits the phosphor emission is used. According to yet other preferred embodiments of the invention, the second layer 7 shows a reflection band broader than the wavelength range emitted by the pump so that it also reflects the emission range by the second phosphor 2 which might get absorbed by the first phosphor 1.

Figure 6:
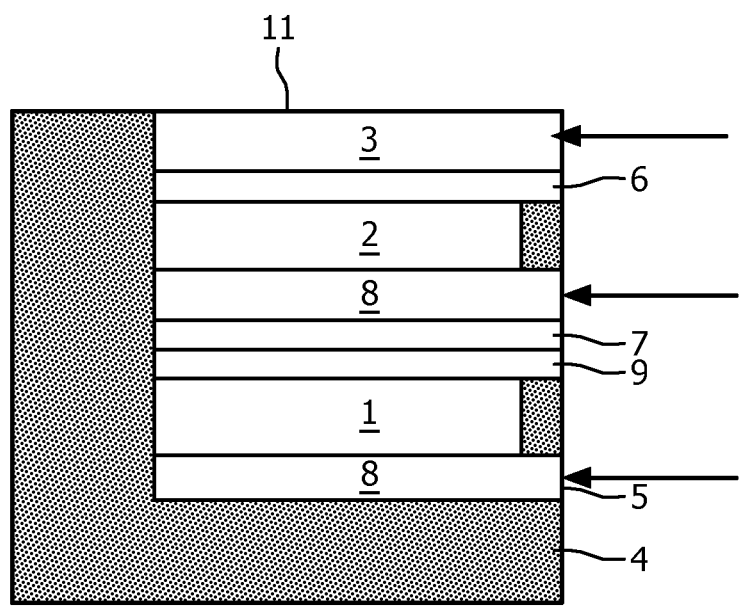
FIG. 6 shows a sixth configuration of a color temperature variable light emitter according to a sixth preferred embodiment of the invention.

FIG. 6 shows a sixth configuration of a color temperature variable light emitter according to a sixth preferred embodiment of the invention. This configuration serves for producing colored light. The light extraction layer 3 corresponds to a waveguide light extraction layer for blue light according to the sixth preferred embodiment of the invention. The first layer 6 comprises a low refractive index material. However, according to other preferred embodiments of the invention the first layer 6 corresponds to an air gap. From this first layer 6 to a large extent no pump light is sent in the direction of the second phosphor 2.

The second phosphor 2 corresponds to a green emitting phosphor arranged on top of a waveguide 8. It is noted that the second phosphor 2 shows good light scattering properties sending emitted light in the direction of layer 3 and out of the device according to the sixth preferred embodiment of the invention. According to other preferred embodiments of the invention, when a transparent phosphor 2 with a material showing low light scattering is used, then a structure at the interface with the first layer 6 with good light extraction properties such as a photonic crystal or a roughened diffuse surface is preferably used.

The second layer 7 corresponds to a layer, which preferably reflects the part of the spectrum of green light that would be absorbed by the first phosphor 1 and transmits red light according to the sixth preferred embodiment of the invention. The color temperature variable light emitter further comprises a third layer 9 arranged between the second layer 7 and the first phosphor 1. According to the sixth preferred embodiment of the invention, when a transparent phosphor 1 with a material showing low light scattering is used, the third layer 9 is an air interface. According to other preferred embodiment of the invention, the third layer 9 is a low refractive index material.

The first phosphor 1 corresponds to a red emitting phosphor material placed on top of the waveguide 8. Again, the material is preferably a light scattering material sending emitted light in the direction of layer 7 or it may have a structure at the interface with the third layer 9 corresponding to a light extraction structure such as a photonic crystal or a roughened diffuse surface. According to other preferred embodiments of the invention, the air gap or the low refractive index layer is omitted and/or replaced by a layer adapted for reflecting the pump light. According to other preferred embodiments of the invention, an air gap or the low refractive index layer is placed between the waveguide and the reflector 4 when a transparent phosphor showing low light scattering is used.

Figure 7:
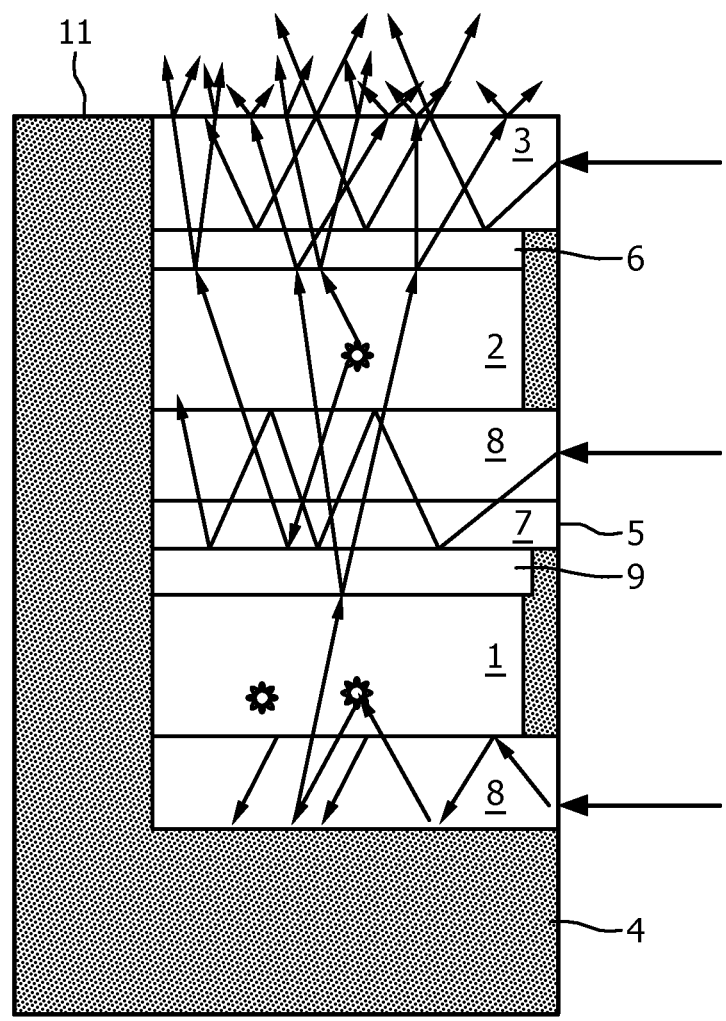
FIG. 7 schematically illustrates the behavior of various colors at various interfaces according to the sixth preferred embodiment of the invention.

FIG. 7 schematically illustrates the behavior of various colors at various interfaces according to the sixth preferred embodiment of the invention and referring to the embodiment of FIG. 6.

Figure 8:
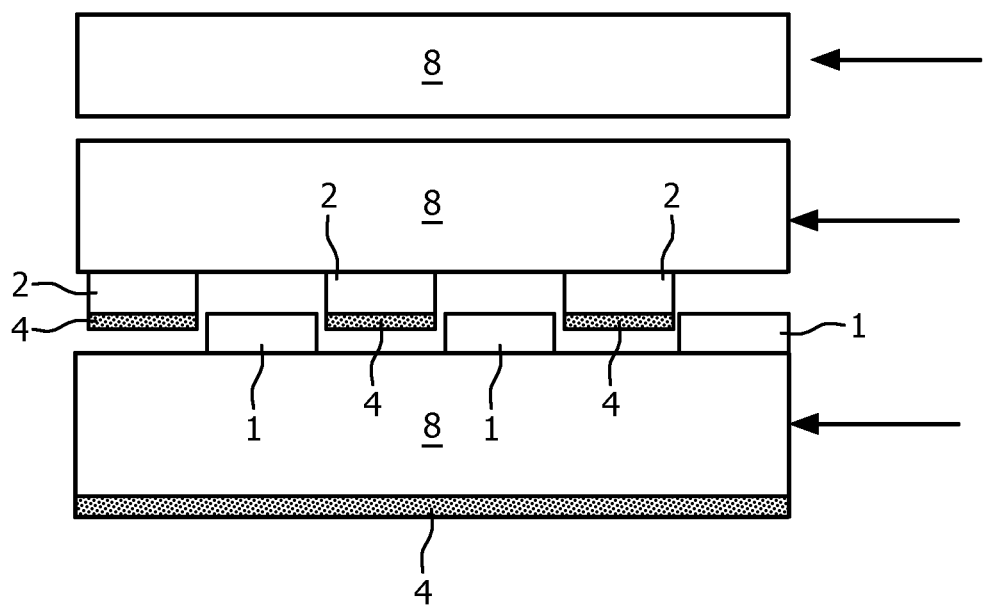
FIG. 8 shows a first pattern wise configuration of a color temperature variable light emitter according to the seventh preferred embodiment of the invention.

FIG. 8 shows a first pattern wise configuration of a color temperature variable light emitter according to a seventh preferred embodiment of the invention. The above-mentioned embodiments of the invention are realized in a pattern wise manner as shown in FIG. 8. Three waveguides 8 are arranged in the stacking direction, wherein between two waveguides 8 a first phosphor 1 and a second phosphor 2 are arranged in a pattern-wise manner such that surfaces of phosphors 1, 2 do not overlap. The phosphors are preferably in optical contact with their respective waveguide.

Figure 9:
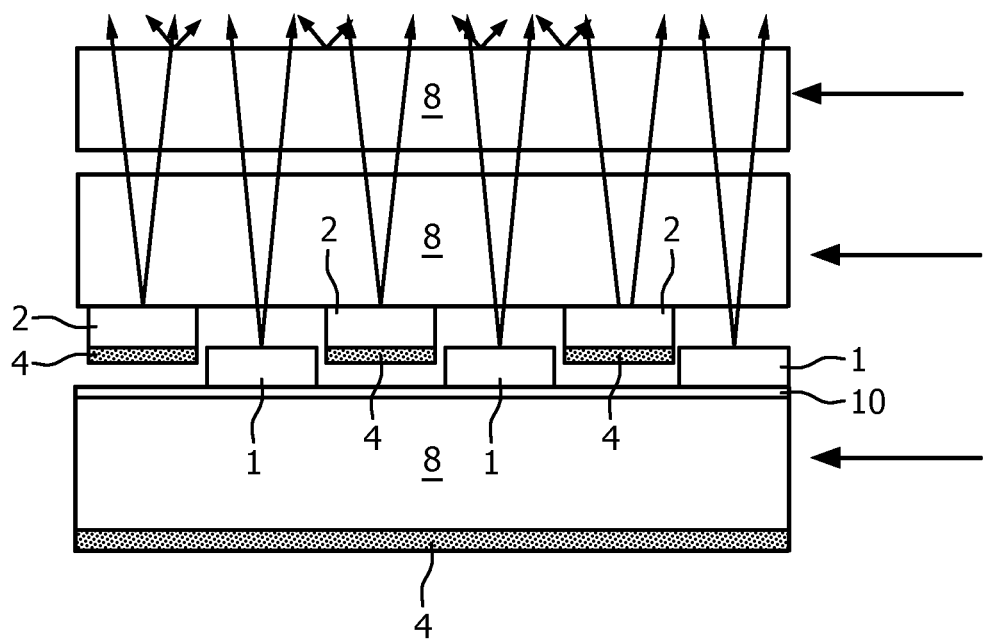
FIG. 9 shows a second pattern wise configuration of a color temperature variable light emitter according to the eighth preferred embodiment of the invention.

FIG. 9 shows a second pattern wise configuration of a color temperature variable light emitter according to an eighth preferred embodiment of the invention. The difference to FIG. 8 is that the color temperature variable light emitter comprises a separation layer 10 corresponding to a red reflecting blue transmitting layer 10 that is arranged between a waveguide 8 and the configuration which comprises the first phosphor 1 and the second phosphor 2, wherein the separation layer 10 is adapted for separating a wavelength comprised by the color temperature variable light and thus it serves for a better color separation so that re-emission goes preferably to areas where green phosphor is absent.

Preferably, the luminescent phosphor material is a highly transparent ceramic phosphor. According to other preferred embodiments of the invention, luminescent materials are selected from garnets and nitrides, preferably doped with trivalent cerium or divalent europium, respectively. Embodiments of garnets comprise $A_3B_5O_{12}$ garnets, wherein A comprises yttrium and/or lutetium and wherein B comprises aluminum. Such garnets are preferably doped with cerium (Ce), with praseodymium (Pr) or a combination of cerium and praseodymium, in particular with Ce. B preferably comprises aluminum (Al). According to other preferred embodiments of the invention, B comprises gallium (Ga) and/or scandium (Sc) and/or indium (In), preferably up to about 20% of Al, more preferably up to about 10% of Al, i.e. the B ions preferably comprise 90 or even more mole % of Al and comprise 10 or even less mole % of one or more of Ga, Sc and In.

B preferably comprises up to about 10% gallium. Preferably, B and O are at least partly replaced by Si and N. The element A is preferably selected from the group comprising yttrium (Y), gadolinium (Gd), terbium (Tb) and lutetium (Lu). Further, Gd and/or Tb are preferably present up to an amount of about 20% of A. Preferably, the garnet luminescent material comprises $(Y_{1-x}Lu_x)_3B_5O_{12}$:Ce, wherein x is equal to or larger than 0 and equal to or smaller than 1. The term ":Ce", indicates that at least part of the metal ions (i.e. in the garnets: part of the "A" ions) in the luminescent material is preferably replaced by Ce. For instance, assuming $(Y_{1-x}Lu_x)_3Al_5O_{12}$:Ce, part of Y and/or Lu is replaced by Ce. The person skilled in the art knows this notation. Ce will replace A in general for not more than 10%; in general, the Ce concentration will be in the range between 0.1% to 4%, especially between 0.1% to 2% (relative to A). Assuming 1% Ce and 10% Y, the full correct formula is $(Y_{0.1}Lu_{0.89}Ce_{0.01})_3Al_5O_{12}$. Ce in garnets is preferably in the trivalent state, as known to the person skilled in the art.

The red luminescent material preferably comprises a material selected from the group comprising (Ba, Sr, Ca)S: Eu, (Ba, Sr, Ca)AlSiN$_3$:Eu and (Ba, Sr, Ca)$_2$Si$_5$N$_8$:Eu. In these compounds, europium (Eu) is preferably divalent, and replaces one or more of the indicated divalent cations. In general, Eu will not be present in amounts larger than 10% of the cation, preferably in the range between about 0.5 to 10, more preferably in the range between about 0.5 to 5% relative to the cation(s) it replaces. The term ":Eu", indicates that part of the metal ions is replaced by Eu (such as by Eu$^{2+}$). For instance, assuming 2% Eu in CaAlSiN$_3$:Eu, the correct formula is (Ca$_{0.98}$Eu$_{0.02}$)AlSiN$_3$. Divalent europium preferably replaces divalent cations, such as the above divalent alkaline earth cations, preferably Ca, Sr or Ba.

The material (Ba, Sr, Ca)S:Eu can also be indicated as MS:Eu, wherein M comprises an element selected from the group comprising barium (Ba), strontium (Sr) and calcium (Ca). Preferably, M comprises in this compound calcium or strontium, or calcium and strontium, more preferably calcium. Here, Eu is introduced and preferably replaces at least a part of M (i.e. at least one of Ba, Sr, and Ca). Further, the material (Ba, Sr, Ca)$_2$Si$_5$N$_8$:Eu can also be indicated as M$_2$Si$_5$N$_8$:Eu, wherein M comprises an element selected from the group comprising barium (Ba), strontium (Sr) and calcium (Ca). Preferably, M comprises in this compound Sr and/or Ba. According to another preferred embodiment, M comprises Sr and/or Ba (neglecting the presence of Eu), more preferably 50% to 100%, more preferably 50 to 90% Ba and 50% to 0%, most preferably 50% to 10% Sr, such as Ba$_{1.5}$Sr$_{0.5}$Si$_5$N$_8$:Eu (i.e. 75% Ba; 25% Sr). Here, Eu is introduced and preferably replaces at least a part of M i.e. at least one of Ba, Sr, and Ca.

Likewise, the material (Ba, Sr, Ca)AlSiN$_3$:Eu is indicated as MAlSiN$_3$:Eu, wherein M comprises an element selected from the group comprising barium (Ba), strontium (Sr) and calcium (Ca). M preferably comprises in this compound calcium or strontium, or calcium and strontium, more preferably calcium. Here, Eu is introduced and preferably replaces at least a part of M (i.e. at least one of Ba, Sr, and Ca). BaMgAl10O17:Eu2+ (BAM) comprises a suitable material which emits in the blue.

Inorganic phosphors with a cubic crystal structure are most preferred due to their high transparency even in a polycrystalline state. Preferably, also highly transparent polymers are used, such as poly methyl methacrylate doped with organic luminescent small molecules such as difluoro-boraindacene family (BODIPY), fluorescein dyes, fluerene derivatives, coumarin dyes, xanthene dyes, pyromethene-BF2 (P-BF2) complexes, stillbene derivatives, rodamine dyes, perylene carboximide dyes and luminescent organic metal complexes such as Lanthanide(III) b-diketonate complexes. It is possible to use luminescent polymers such as polyphenylenevinylenes (PPV)'s derivatives, polyphenyls, and poly fluerenes and their copolymers and mixtures.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A color temperature variable light emitter comprising:
a first phosphor and a second phosphor, the first phosphor and the second phosphor, when pumped with pump light, being adapted for emitting first phosphor light and second phosphor light, respectively, the first phosphor light having a different wavelength from the second phosphor light; and
an exit surface adapted for emitting the color temperature variable light; and
a light extraction layer optically coupled to the exit surface;
wherein the first phosphor and the second phosphor are stacked in a stacking direction in such a way that: (i) at least part of the first phosphor light and at least part of the second phosphor light are combined in the exit surface and emitted as the color temperature variable light; and (ii) the first phosphor and the second phosphor can be individually pumped by first pump light and second pump light, respectively, the first pump light and the second pump light being incident laterally relative to the stacking direction, and perpendicular to the exit surface;
wherein the light extraction layer is configured to direct optical radiation irradiated in the stacking direction toward the exit surface.

2. The color temperature variable light emitter according to claim 1, further comprising a reflector which is arranged on at least part of a surface of one or more of the first phosphor and the second phosphor, wherein the reflector is adapted for redirecting at least a part of the optical radiation back to one or more of the first phosphor and the second phosphor, respectively.

3. The color temperature variable light emitter according to claim 1, wherein the first phosphor and the second phosphor are arranged such that a surface of the second phosphor is at least partly overlapping with a surface of the first phosphor or a surface of the second phosphor is close to a surface of the first phosphor such that emission from the first phosphor and the second phosphor interact.

4. The color temperature variable light emitter according to claim 1, further comprising a selective reflector arranged on at least a part of a side surface of the first phosphor and/or the second phosphor, wherein the selective reflector is adapted for selectively transmitting the pump light and for selectively reflecting at least a part of the phosphor light emitted towards the selective reflector back to at least one of the first phosphor and the second phosphor.

5. The color temperature variable light emitter according to claim 2, wherein the reflector is connected to a heat sink adapted for cooling at least one of the first phosphor and the second phosphor.

6. The color temperature variable light emitter according to claim 1, wherein a first layer is arranged between the second phosphor and the light extraction layer and is adapted for reflecting pump light and for transmitting phosphor light.

7. The color temperature variable light emitter according to claim 6, further comprising a second layer arranged between the first phosphor and the second phosphor, wherein the second layer is adapted for reflecting pump light and for one or more of reflecting and transmitting phosphor light.

8. The color temperature variable light emitter according to claim 6, wherein the first layer is air or a transparent low refractive index material.

9. The color temperature variable light emitter according to claim 2, further comprising at least one waveguide arranged in the stacking direction between a part of the reflector and the exit surface, wherein the waveguide is adapted for directing optical radiation at least partly parallel to the stacking direction into the first phosphor and/or the second phosphor, respectively.

10. The color temperature variable light emitter according to claim 1, wherein at least one of the first phosphor and the second phosphor is highly transparent showing low scattering.

11. The color temperature variable light emitter according to claim 1, wherein the at least one of first phosphor and the second phosphor comprises an aspect ratio >2, preferably >10, more preferably >100.

12. The color temperature variable light emitter according to claim 1, wherein at least one of the first phosphor and the second phosphor is optically coupled to at least one waveguide.

13. The color temperature variable light emitter according to claim 1, wherein the first phosphor and the second phosphor are placed in a patterned manner on waveguides and stacked such that a surface of the second phosphor does not overlap with a surface of the first phosphor.

* * * * *